United States Patent [19]

Nishimura

[11] Patent Number: 5,043,779
[45] Date of Patent: Aug. 27, 1991

[54] METAL OXIDE SEMICONDUCTOR DEVICE WITH WELL REGION

[75] Inventor: Takeyoshi Nishimura, Matumoto, Japan

[73] Assignee: Fuji Electric Co., Ltd., Kawasaki, Japan

[21] Appl. No.: 557,178

[22] Filed: Jul. 23, 1990

[30] Foreign Application Priority Data

Jul. 21, 1989 [JP] Japan .................................. 1-189851

[51] Int. Cl.⁵ ..................... H01L 29/10; H01L 29/68; H01L 29/06
[52] U.S. Cl. ................................. 357/23.4; 357/23.8; 357/20
[58] Field of Search ....................... 357/23.4, 20, 23.8, 357/37, 38

[56] References Cited

U.S. PATENT DOCUMENTS

| 4,206,469 | 6/1980 | Hanes et al. | 357/23.4 |
| 4,593,302 | 6/1986 | Lidow et al. | 357/20 |
| 4,803,532 | 2/1989 | Mihara | 357/20 |
| 4,821,095 | 4/1989 | Temple | 357/20 |
| 4,965,647 | 10/1990 | Takahashi | 357/23.4 |

Primary Examiner—William Mintel
Assistant Examiner—Robert P. Limanek
Attorney, Agent, or Firm—Brumbaugh, Graves, Donohue & Raymond

[57] ABSTRACT

An MOS device where the avalanche breakdown strength may be increased without decreasing the on-resistance of the device is provided by decreasing the width of a high impurity concentration area in contact with one of the two electrodes to increase the curvature of the deepest part of the well region.

2 Claims, 2 Drawing Sheets

METAL OXIDE SEMICONDUCTOR DEVICE WITH WELL REGION

FIELD OF THE INVENTION

The present invention relates to a MOS device with multiple MOS structures distributed on the surface of the same semiconductor substrate.

BACKGROUND OF THE INVENTION

In a conventional Metal oxide semiconductor field effect transistor (MOSFET) or insulated gate bipolar transistor (IGBT), the MOS structures are distributed on one face of the semiconductor substrate to control the main current flowing between two electrodes on opposing faces of the substrate. FIG. 2 shows a part of such an MOS device. The MOSFET structure has p-type channel areas 2, distributed on the surface of the n-type base area 1 of the silicon substrate. The portion of the base area 1 which is exposed in relation to the gate 5, lies between the p-type channel areas 2, forming a p+ well 3 at the center of the channel area 2. Located at the periphery of the exposed base area is the n+ source area 4. The gate 5 consists of polycrystal silicon and is generated through the gate oxide film to form the channel in the part between the source area 4 and the base area 1. The source electrode 8, insulated from the gate 5 by the insulating layer 7, is in contact with both the p+ well 3 and the source area 4.

The p+ well 3 lowers the contact resistance between the source electrode and the channel area, and makes it more difficult to activate the parasitic NPN transistor consisting of the n+ source area 4, p-type channel area 2, and n-type base area 1. In this semiconductor device, applying the reverse bias to the PN junction between the n-type base area 1 and the p-type channel area 2, and between the n-type base area 1 and the p+ well 3, generates a depletion area 10, indicated with a dotted line in FIG. 2. This is accomplished by applying a voltage across the electrode in contact with the n+ layer on the opposite side of the base area 1, or with the p+ layer on the outside of the n+ layer and the source electrode 8. When the reverse bias is sufficiently high, a breakdown occurs in this PN junction, and diffusion in the p+ well 3 is deeper with respect to the p-type channel area 2. Consequently, avalanche breakdown occurs at the tip of the p+ well 3. This suppresses current into the parasitic bipolar transistor, or, if that current flows, it is difficult to turn on the transistor because of the low base resistance of the transistor. When the parasitic transistor is activated, although a large current flows through the PN junction lowering the avalanche breakdown strength, the avalanche breakdown strength can be increased since the avalanche breakdown, which occurs at the tip of the p+ well, makes it more difficult to activate the parasitic NPN transistor.

When diffusion in the p+ well 3 is deep, the base area must be thick or its resistance high to maintain the avalanche voltage, i.e., the voltage above which breakdown occurs, between the p-type channel area 2 and the n-type base area 1, and between the p+ well 3 and the n-type base area 1. This causes two problems. One is that the activation resistance ($R_{DS(ON)}$) increases when the MOSFET formed on the surface is turned on. The other is that the diffusion time to deepen the diffusion must be longer.

SUMMARY OF THE INVENTION

It is an object of the present invention to provide a metal oxide semiconductor device that can increase the avalanche breakdown strength, i.e., increase the point at which breakdown occurs, by narrowing the width of the high impurity concentration well region, while not increasing the activation-resistance of the MOSFET formed on the surface, and also not requiring a long diffusion time.

The present invention is an MOS device which forms, on the same semiconductor substrate, a plurality of structures disposed on and embedded in a base area of a first conductivity type, arranged in an equally spaced array contiguous with a first surface of the base area. Each structure contains a channel area of a second conductivity type, also contiguous with a first surface of the base area, such that the spacing between two consecutive channel areas in two consecutive structures is less than the width of one of the channel areas. Also contained in each structure is a well region of the second conductivity type, having a high impurity concentration relative to the channel area, extending into the base area to a greater extent than the channel area. Located near the periphery of the channel area is a substantially annular source area of the first conductivity type. The source area has an outer dimension less than that of the channel area, and extends into the base area to a lesser extent than the channel area. A gate is disposed through a layer of gate oxide film on the surface of each structure. A source electrode is also disposed on the surface of each structure.

In accordance with the invention, the width of the channel area and the width of the source area have certain dimensions to obtain the desired activation characteristics of the MOSFET formed on the surface. Decreasing the width of the channel area makes the width of the high impurity well narrower. When the well region is made narrower, the curvature at the deepest part of the well region is larger. This deepest part has an avalanche breakdown when the reverse bias is applied between the base area and the channel area, or between the base area and the well region. At that point, current flows into the deepest part of the well region. This suppresses the current from flowing into the parasitic bipolar transistor, making it difficult to turn the transistor on. The result is an enhanced avalanche breakdown strength. Alternatively, using the ring-shaped well, shown in FIG. 3(b), on the otherwise similar MOS device has the same effect by increasing the curvature in the deepest part of the well region.

DESCRIPTION OF PREFERRED EMBODIMENT

Figure 1:
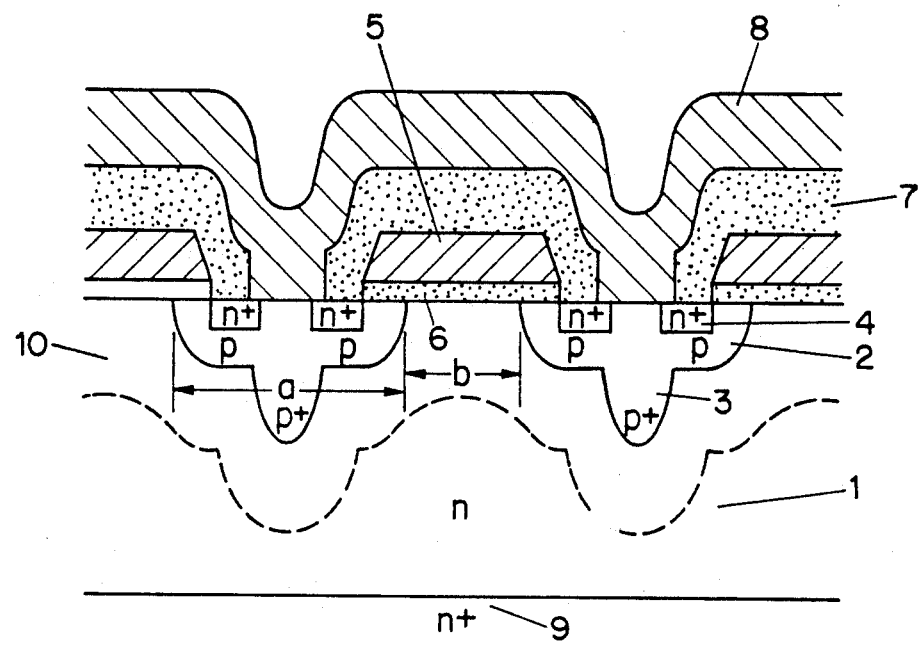
FIG. 1 is a sectional view of an embodiment of the present invention.
Figure 2:
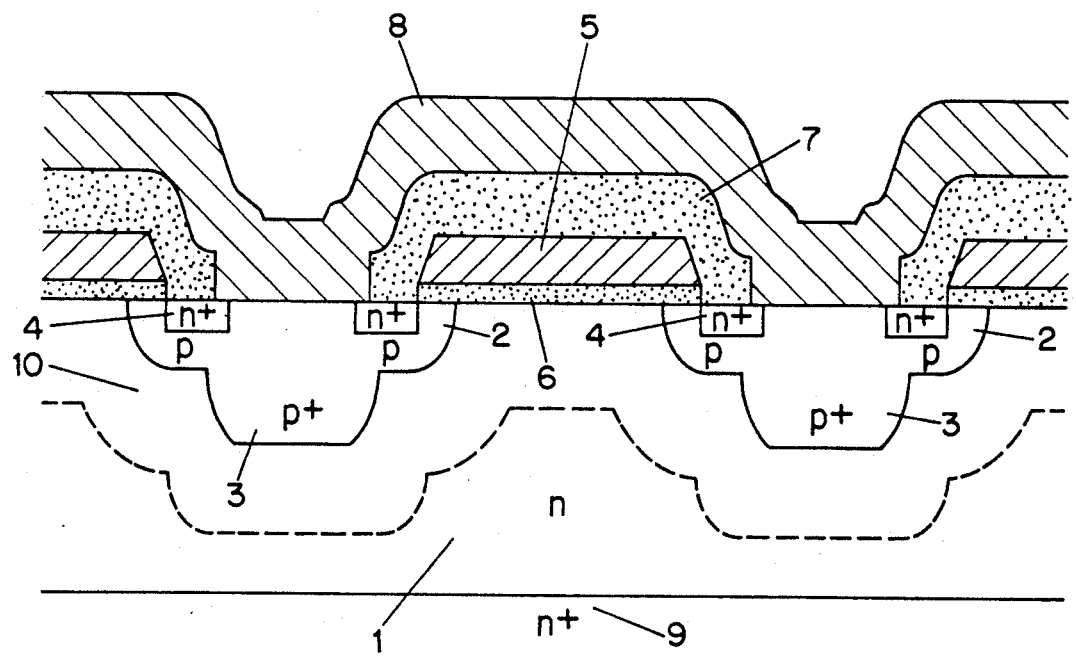
FIG. 2 is a sectional view of a conventional MOS device.

FIG. 1 shows an embodiment of the present invention, an MOS device with an avalanche voltage of 500 V. The parts in FIG. 1 common to those in FIG. 2 have the same reference numbers. FIG. 1 shows the same structure as FIG. 2, except for the shorter spacing b between two p-type channel areas 2, that is, b is approximately 70% of the width of one channel area. This results in an increase of the curvature at the tip of the p+ well 3. When a reverse bias is applied between the n-type base area 1 and the p-type channel area 2, and between the n-type base area 1 and the p+ well, the well region has a high field concentration. Therefore, without deepening the p+ well 3, the avalanche breakdown can occur at the tip of the p+ well 3 to suppress current from flowing into the parasitic bipolar transistor.

Figure 3A:
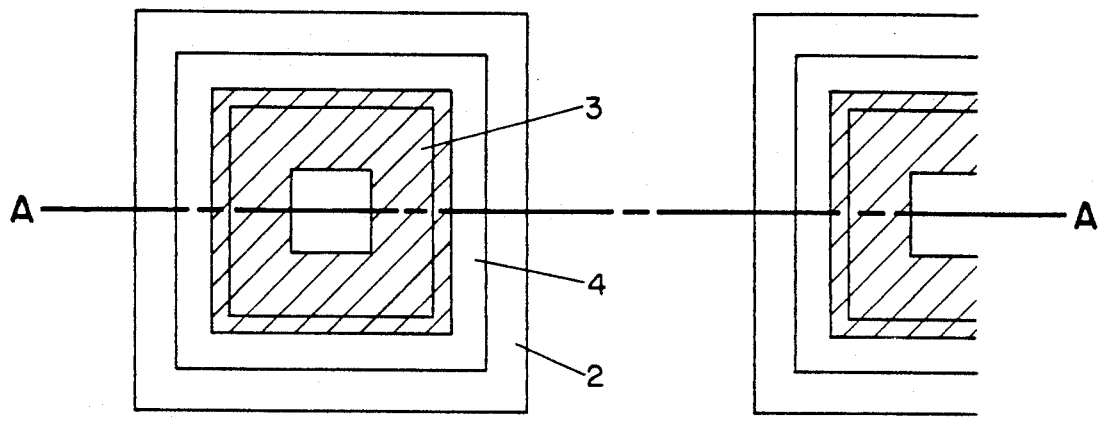
FIG. 3(a) and (b) show a second embodiment of the present invention; (a) is a perspective plan view, and (b) is a sectional view of the A-A line.
Figure 3B:
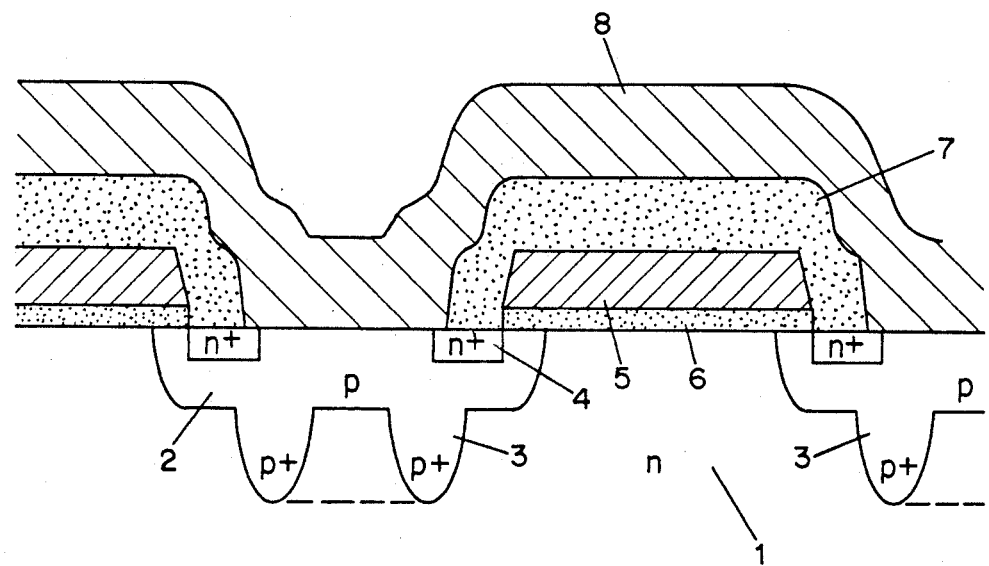

FIGS. 3(a) and (b) show a second embodiment of the present invention. The parts common to those in FIG. 1 have the same reference numbers. As indicated with diagonals in the plan in FIG. 3(b), the p+ well 3 is an angular ring. This shape is effective in increasing the curvature of the p+ well tip. Therefore, avalanche breakdown occurs at that tip in the same manner as in FIG. 1.

The present invention can also be embodied in the p− channel semiconductor device of opposite conductivity types.

I claim:

1. A metal oxide semiconductor device comprising:
   (a) a semiconductor substrate,
   (b) a base area of a first conductivity type disposed on a first surface of the substrate,
   (c) a plurality of structures disposed on and embedded in the base area, arranged in an equally spaced array contiguous with a first surface of the base area, each of which comprises:
      (i) a channel area of a second conductivity type also contiguous with the first surface of the base area, wherein the spacing between two consecutive channel areas in immediately adjacent structures is less than the width of one of the channel areas,
      (ii) a well region of the second conductivity type having a high impurity concentration relative to the channel area, disposed in the center of the channel area extending into the base area to a greater extent than the channel area,
      (iii) an annular source area of the first conductivity type, located within the periphery of the channel area, said source area having an outer dimension less than that of the channel area, and extending into the base area to a lesser extent than that of the channel area,
   (d) a gate through an insulating film disposed on the surface of each structure,
   (e) a source electrode disposed on the surface of each structure, wherein the well region is a ring-shaped area surrounding the center of the channel area.

2. A device according to claim 1, wherein the spacing between two adjacent structures is approximately 70% the width of one channel area.

* * * * *